(12) United States Patent
Koch et al.

(10) Patent No.: US 7,295,014 B2
(45) Date of Patent: Nov. 13, 2007

(54) METHOD FOR DETERMINATION OF CHARACTERISTIC VARIABLE WHICH RELATES TO THE STATE OF CHARGE OF A STORAGE BATTERY

(75) Inventors: Ingo Koch, Hameln (DE); Eberhard Meissner, Wunstorf (DE)

(73) Assignee: VB Autobatterie GmbH, Hannover (DE)

( * ) Notice: Subject to any disclaimer, the term of this patent is extended or adjusted under 35 U.S.C. 154(b) by 426 days.

(21) Appl. No.: 10/911,990

(22) Filed: Aug. 5, 2004

(65) Prior Publication Data

US 2005/0062458 A1   Mar. 24, 2005

(30) Foreign Application Priority Data

Aug. 6, 2003   (DE)   ................. 103 35 928

(51) Int. Cl.
   G01N 27/416   (2006.01)
   G01N 27/42    (2006.01)
(52) U.S. Cl. .................. 324/432; 324/426; 324/425
(58) Field of Classification Search ................ 320/132, 320/134; 324/425, 426, 427, 428, 432
   See application file for complete search history.

(56) References Cited

U.S. PATENT DOCUMENTS 6,388,450 B2 *   5/2002   Richter et al. ............... 324/427
6,531,874 B2 *   3/2003   Mentgen et al. ............ 324/427

FOREIGN PATENT DOCUMENTS

| DE | 2 242 510     | 4/1974 |
| DE | 40 07 883 A1  | 9/1991 |
| DE | 43 39 568 A1  | 5/1995 |
| DE | 195 43 874 A1 | 5/1996 |
| DE | 198 47 648 A1 | 4/2000 |
| DE | 100 02 473 A1 | 7/2001 |
| DE | 100 56 971 A1 | 5/2002 |
| DE | 101 03 848 A1 | 8/2002 |

* cited by examiner

Primary Examiner—Karl Easthom
Assistant Examiner—Richard V. Muralidar
(74) Attorney, Agent, or Firm—Foley & Lardner LLP

(57) ABSTRACT

A method for determining a state of charge (SOC) characteristic variable for a storage battery including determining a first SOC value and a second SOC value. The method further including determining changes in the first and second SOC values. These changes in the first and second SOC values are measured between a first operating time and a second operating time. The method also including determining a characteristic variable relating to the state of charge as a function of the change in the first and second SOC values.

32 Claims, 3 Drawing Sheets

Rest Voltage vs. Acid Density For Six-Cell Lead-Acid Rechargeable Battery

METHOD FOR DETERMINATION OF CHARACTERISTIC VARIABLE WHICH RELATES TO THE STATE OF CHARGE OF A STORAGE BATTERY

CROSS-REFERENCE TO RELATED PATENT APPLICATIONS

This application claims the benefit under 35 U.S.C. § 119 of German Patent Application DE 103 35 928.1, which was filed on Aug. 6, 2003, and which is incorporated herein by reference in its entirety, including the specification, drawings, claims and abstract.

BACKGROUND

The present invention relates to a method for determining a characteristic variable which relates to the state of charge of a storage battery.

It may be desirable to determine or to predict at any given time the state of an electrochemical storage battery (e.g., the state of charge or the heavy-current load capacity).

By way of example, the capability of a starter battery to start a motor vehicle with an internal combustion engine is governed by the state of charge and the state of aging, or by the capacity drop which has occurred, of the battery, since the current level which can be drawn from the starter battery and the power which can be emitted are limited. It may be desirable to determine the state of charge or the starting capability of a starter battery in situations in which, for example, the engine is operated intermittently, since, in this case, the vehicle electrical power supply system, together with its loads, is still operated in periods in which the engine is switched off, although the generator is not producing any electrical power. In cases such as this, the monitoring of the state of charge and the starting capability of the storage battery must ensure the energy content of the storage battery always remains sufficient to still start the engine.

Widely differing methods are known for measurement of the state of charge of storage batteries. By way of example, integrating test equipment (amp-hour (Ah) meters) is used for this purpose, with the charging current being taken into account, and possibly being weighted with a fixed charging factor. Since the usable capacity of a storage battery is highly dependent on the magnitude of the discharge current and on the temperature, even methods such as these may not allow a satisfactory statement to be made about the usable capacity which can still be drawn from the battery.

By way of example, in the case of a method for measurement of the state of charge, it is known from DE 22 42 510 C1 for the charging current to be weighted with a factor which is itself dependent on the temperature and on the state of charge of the battery.

DE 40 07 883 A1 describes a method in which the starting capability of a storage battery is determined by measurement of the battery terminal voltage and the battery temperature, and by comparison with a state of charge group of characteristics which is applicable to the battery type to be tested.

DE 195 43 874 A1 discloses a calculation method for the discharge characteristic and remaining capacity measurement of a storage battery, in which the current, voltage and temperature are likewise measured, with the discharge characteristic being approximated by means of a mathematical function with a curved surface.

DE 39 01 680 C1 describes a method for monitoring the cold starting capability of a starter battery, in which the starter battery is loaded with a resistance at times. The voltage which is dropped across the resistance is measured, and, in comparison with empirical values, it is used to determine whether the cold starting capability of the starter battery is still adequate. The starting process is in this case used to load the starter battery.

Furthermore, DE 43 39 568 A1 discloses a method for determination of the state of charge of a motor vehicle starter battery, in which the battery current and a rest voltage are measured, and from which the state of charge is deduced. In this case, the battery temperature is also taken into account. The charging currents which are measured during different time periods are compared with one another, and a remaining capacity is determined from them.

DE 198 47 648 A1 describes a method for learning a relationship between the rest voltage and the state of charge of a storage battery for the purpose of estimation of the storage capability. A measure for the acid capacity of the electrolyte of the storage battery is determined from the relationship between the rest voltage difference and the amount of current transferred during the load phase. In this case, use is made of the fact that the rest voltage rises approximately linearly with the state of charge in the higher state of charge ranges which are relevant in practice.

One problem of determining the state of an electrochemical storage battery with known methods is that wear factors which are not all relevant are taken into account, particularly when acid stratification is present.

In the case of a lead-acid rechargeable battery, the electrolyte is composed of dilute sulfuric acid, that is to say, a solution of $H_2SO_4$ in water. Typically, this is an approximately 4 to 5 molar solution when in the completely charged state. During the discharge reaction, $H_2SO_4$ in the electrolyte is consumed at both electrodes in accordance with the reaction equations:

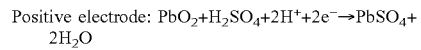
Positive electrode: $PbO_2+H_2SO_4+2H^++2e^-\rightarrow PbSO_4+2H_2O$

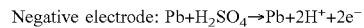
Negative electrode: $Pb+H_2SO_4\rightarrow Pb+2H^++2e^-$ and, furthermore $H_2O$ is formed at a positive electrode. The concentration and the specific gravity of the electrolyte thus fall during discharging, while they rise again during the charging reaction, which takes place in the opposite manner.

If the sulfuric acid which is formed during the charging reaction has the capability to be convected in the field of gravity of the earth, then it has the tendency to fall in layers to the bottom of the cell vessel of the lead-acid rechargeable battery cells. An electrolyte in a higher concentration is then located in the lower area of the respective cell vessel than in the upper area of the cell vessel. In the case of a lead-acid rechargeable battery, this state is referred to as acid stratification.

Since both the charging reaction and the discharge reaction as well as the parasitic reactions, such as gas development, corrosion etc., are in general influenced by the electrolyte concentration, acid stratification leads to nonuniformity in the state of the cell.

It would thus be advantageous to provide an improved method for determination of a characteristic variable which relates to the state of charge of a storage battery.

SUMMARY

An exemplary embodiment relates to a method for determining a characteristic variable which relates to the state of charge (SOC) of a storage battery. The method includes determining a first state of charge value which relates to a first parameter for a first operating time and for a second operating time and determining a second state of charge value which relates to a second parameter for the first operating time and for the second operating time. The method also includes determining a first state of charge change of the first state of charge value from the first operating time to the second operating time and determining a second state of charge change of the second state of charge value from the first operating time to the second operating time. The method also includes determining a characteristic variable which relates to the state of charge as a function of the first state of charge change and of the second state of charge change.

DETAILED DESCRIPTION OF THE EXEMPLARY EMBODIMENTS

Figure 1:
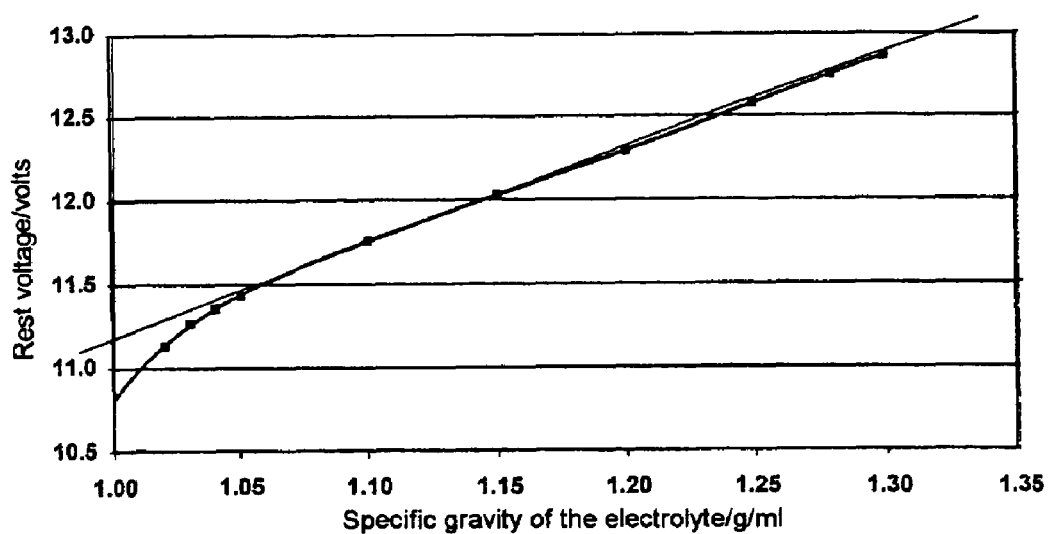
FIG. 1 shows a graph of the profile of the rest voltage as a function of the acid density for a lead-acid rechargeable battery with six cells connected in series.

According to an exemplary embodiment, a method for determining a characteristic variable which relates to the state of charge of a storage battery includes determination of a first state of charge value which relates to a first parameter, in each case for a first operating time and a second operating time; determination of a second state of charge value which relates to a second parameter, in each case for a first operating time and a second operating time; determination of a first state of charge change of the first state of charge value from the first to the second operating time; determination of a second state of charge change of the second state of charge value from the first to the second operating time; and determination of the characteristic variable which relates to the state of charge as a function of the first state of charge change and of the second state of charge change.

The method is based on the surprising discovery that different methods for determination of the state of charge value are influenced differently by wear factors, so that different state of charge changes result for different methods. The wear factors are then considered as far as possible together in the determination of an improved state of charge value, if this is determined as a function of the two state of charge changes which have been determined using a first and a second method.

Particularly when acid stratification is present in the storage battery, the voltage signal from the storage battery that is used to determine the state of charge exhibits a greater reduction in the state of charge than that which results from the charge balance which is used as the second method for determination of the state of charge, provided that a net discharge takes place between the first and the second operating time. If a net charge occurs between the first and the second operating time, a greater increase in the state of charge than would result from the charge balance is evident when the state of charge is determined on the basis of the voltage of the storage battery.

It is thus advantageous to use the voltage of the storage battery, and in particular the rest voltage, as the first parameter for determination of the state of charge values. The current throughput is preferably used as the second parameter for determination of the second state of charge value, with the current which flows between the first operating time and the second operating time preferably being balanced as the amount of charge transferred.

In this case, for the reasons mentioned above, it is advantageous to determine the characteristic variable which relates to the state of charge as a function of whether a net discharge from or a net charge to the storage battery takes place in the time period between the first operating time and the second operating time.

An improved state of charge value can then be determined from the first and second state of charge changes, with the most probable individual value being most heavily weighted. The state of charge can thus be determined, for example, as a function of which absolute value of the first state of charge change and of the second state of charge change is the greater.

It is advantageous, if there is a net discharge in the time period between the first operating time and the second operating time, to use the state of charge value, which was determined at the second operating time and relates to the current throughput of the storage battery, in an emphasized form in order to determine the characteristic variable or the state of charge, provided that the first state of charge change is a state of charge change which relates to the voltage.

In the case of discharge, the first and second state of charge changes which relate to the first and the second parameters are less than zero. If the reduction in the first state of charge change, which is determined by means of the voltage, is greater than the reduction in the state of charge change which is related to the current throughput, it is possible to deduce that acid stratification was present at the first operating time, and had been partially dissipated by the second operating time. The state of charge value which was determined at the second operating time and relates to the current throughput is then used to a greater extent for the determination of an improved state of charge value, since the acid stratification is less after the end of the discharge, and the state of charge value for the second operating time is more trustworthy than the state of charge of the first operating time. Otherwise, the first state of charge value which relates to the current throughput at the second operating time is not used to a greater extent for the determination of an improved state of charge value at the second operating time, since it is deduced that acid stratification is not present.

When a net charge occurs between the first and the second operating time, the presence of acid stratification at the first operating time is deduced, which is partially dissipated by the second operating time, provided that the increase in the first state of charge, which relates to the voltage, is greater than the increase in the state of charge which relates to the current throughput. The first state of charge value which relates to the voltage of the second operating time is then used to a greater extent for the determination of the improved state of charge value at the second operating time since, after the end of the charging process, the acid stratification is less, and the first state of charge value, which relates to the voltage, at the second operating time is thus more credible than the corresponding state of charge value at the first operating time.

Otherwise, it is deduced that acid stratification is not present, and the first state of charge value which relates to the voltage at the second operating time is not used to a greater extent for the determination of the improved state of charge value at the second operating time.

The relationship between the state of charge of a storage battery and the difference between the first state of charge change, which relates to the voltage of the storage battery, and the second state of charge change, which relates to the current throughput, is thus advantageously evaluated in order to determine acid stratification in the electrolyte, with the presence of acid stratification being deduced when, in the case of a net discharge, the first state of charge change is greater than the second state of charge change or when, in the case of a net charge, the first state of charge change is less than the second state of charge change.

In this case, in order to compare the ratio of the magnitudes between the first state of charge change and the second state of charge change, it is advantageous to compare the difference between the first and the second state of charge change with a fixed threshold value, which need not necessarily be zero. It has been found to be advantageous for the threshold value to be in the range from 1 to 10% of the maximum possible state of charge value.

In order to determine the state of charge values which relate to the charge throughput, it is also advantageous to take account only of charge amounts and/or discharge amounts which exceed a fixed minimum value. This fixed minimum value should also preferably be in the range from 1 to 10% of the maximum possible state of charge value.

State of charge values and/or storage capability values determined later can be corrected by the difference, determined earlier, between the first and the second state of charge change, in particular by subtraction of the difference from later state of charge values or storage capability values. In this case, it is advantageous to carry out the correction of the state of charge values determined later or subtraction of the product from the difference in the rated capacity of the later storage capability values times the respective greatest difference in a set of differences. However, it is also possible to correct the state of charge values or storage capability values determined later by means of a set of differences between the first and the second state of charge change, in particular by subtraction of the sum of all the determined differences from later state of charge values, or by subtraction of the product of the difference times the rated capacity of later storage capability values. This results in a calibration value which is used to compensate for corruptions even in those states which are not manifested by any influence on the terminal voltage, in particular corruptions which result from acid stratification and are approximately the same throughout the subsequent operating time.

Furthermore, it has been found to be advantageous for the characteristic variable which relates to the state of charge to be determined as a function of the first and of the second state of charge changes only when both a net charge in one time interval and a net discharge in the other time interval take place in two different time intervals which each have a first and a second operating time. It has been found, that when acid stratification is present, the characteristic of the first state of charge change has a steeper gradient as a function of the second state of charge change in the case of a net discharge than in the case of a net charge. It is thus possible to deduce the presence of acid stratification when the discharge ratio between the first and the second state of charge change in the time interval in which the net discharge has taken place is greater than the charge ratio between the first and the second state of charge change in the other time interval, in which a net charge has taken place.

The process of charging the storage battery can be controlled using the method described above as a function of the determined characteristic variable of the improved state of charge and/or of the first and of the second state of charge changes. The method for determination of a characteristic variable which relates to the state of charge as well as the values which are obtained in this case, in particular the improved state of charge value and/or the first and the second state of charge changes, can then be linked to other methods for determination or prediction of the state or behavior of an energy store.

The rest voltage of a rechargeable battery depends on the electrochemical activity, and thus on the concentration of the components involved. In the case of a lead-acid rechargeable battery, the rest voltage rises strictly monotonally with the acid concentration owing to electrochemical relationships, as is sketched in FIG. 1. If the acid concentration is inhomogenous, as in the illustrated example, then a mixed potential is produced at the poles of the cell, representing a weighted mean of the potentials which occur at the various points in the reaction. In the case of a lead-acid rechargeable battery, this mixed potential is dominated by the point with the maximum acid concentration, that is to say the maximum concentration in the electrochemical active area of the cell can be deduced from the voltage at the pole.

By way of example, the gradient per individual cell is approximately 9.2 mV/0.01 g/ml and is approximately 55 mV/0.01 g/ml per 12-volt block of a lead-acid rechargeable battery.

In the case of rechargeable batteries with solid electrolytes (e.g., so-called sealed rechargeable batteries), in which, for example, the electrolyte is immobilized in a glass fiber mesh or in a gel, the convection of the electrolyte is, in contrast, suppressed or at least very greatly reduced, so that this phenomenon that is dealt with here is less pronounced, or does not occur at all.

The method according to the exemplary embodiment for determination of the state of charge of a storage battery is now based on the discovery that different methods for determination of the state of charge are each influenced differently. In particular, methods which use the voltage signal from the storage battery to determine the state of charge are influenced differently than methods which assess the charge throughput.

In this case, it has surprisingly been found that the discrepancy has a different behavior depending on whether, overall, a net charge or a net discharge has taken place between two operating times. When a net discharge occurs, the voltage signal from the battery for determination of a first state of charge value $SOC_1$ which relates to this registers a greater reduction $\Delta SOC_1$ in the state of charge value $SOC_1$ than is the case for the determination of the second state of charge value $SOC_2$, which relates to the charge balance.

If, on the other hand, a net charge occurs, the voltage signal from the storage battery for determination of the first state of charge value $SOC_1$ which relates to this exhibits a lesser increase $\Delta SOC_1$ in the first state of charge value $SOC_1$. In some circumstances, this is weaker than the increase $\Delta SOC_2$.

An improved state of charge value SOC, which weights the most probable individual value to a greater extent, can now be determined using this different behavior. This will be explained in more detail with reference to FIGS. 2 to 5.

Figure 2:
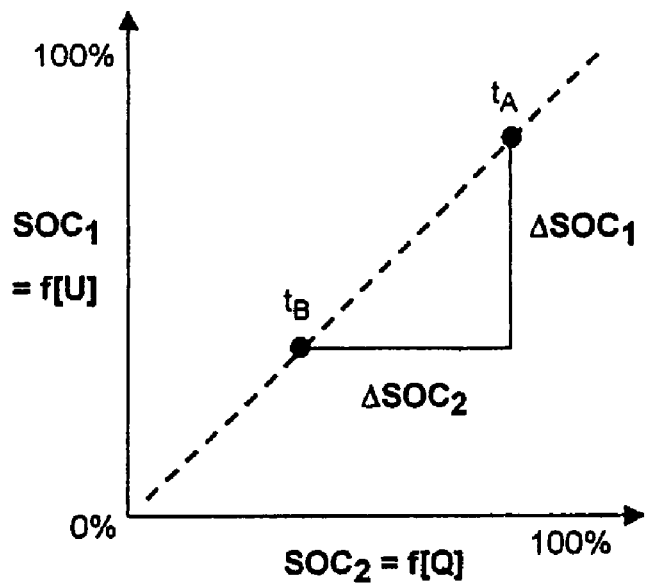
FIG. 2 shows a graph of the ratio between the change in a first state of charge value $SOC_1$ and the change in the second state of charge value $SOC_2$ during discharging, and for approximately the same change.

FIG. 2 shows a graph in which a first state of charge value $SOC_1$, which relates in particular to the voltage of the storage battery, is plotted in the value range from 0 to 100% against a second state of charge value profile $SOC_2$ which, in particular, is related to the current throughput. When a discharge occurs between the time $t_A$ and the time $t_B$, a reduction in the first state of charge $\Delta SOC_1$ in the same order of magnitude as the reduction in the second state of charge $\Delta SOC_2$ can be observed. The magnitudes of the changes are thus comparable. In this case, no preferred weighting is given to the first and the second state of charge values $SOC_1$, $SOC_2$ at the first and/or at the second operating times $t_A$, $t_B$ for determination of the state of charge SOC.

Figure 3:
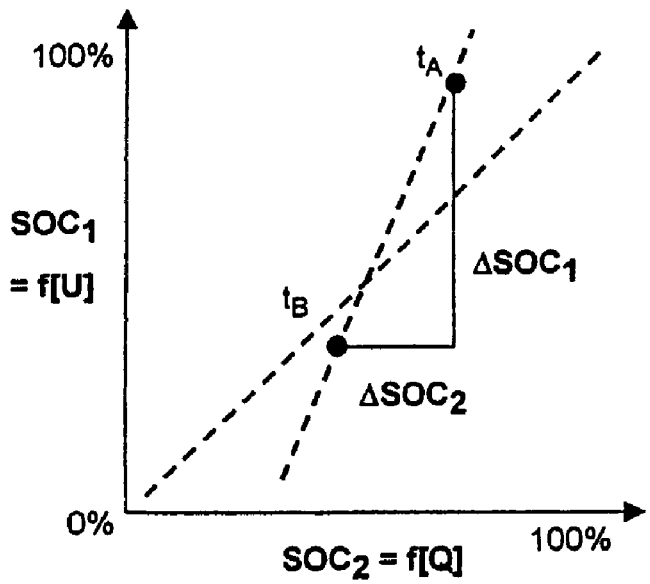
FIG. 3 shows a graph of a major change in the first state of charge value in comparison to the change in the second state of charge value during discharging.

In contrast, FIG. 3 shows the situation with a net discharge, in which the magnitude of the change in the first state of charge value $\Delta SOC_1$ is greater than the magnitude of the change in the second state of charge value $\Delta SOC_2$ between the first and the second operating times $t_A$ and $t_B$. The curve profile of the first state of charge value $SOC_1$, which is plotted against the second state of charge value $SOC_2$, is correspondingly steeper, for example as a result of acid stratification. In this case, the state of charge SOC of the storage battery is preferably determined by excessive weighting of the second state of charge value $SOC_2$, in particular at the second operating time $t_B$.

Figure 4:
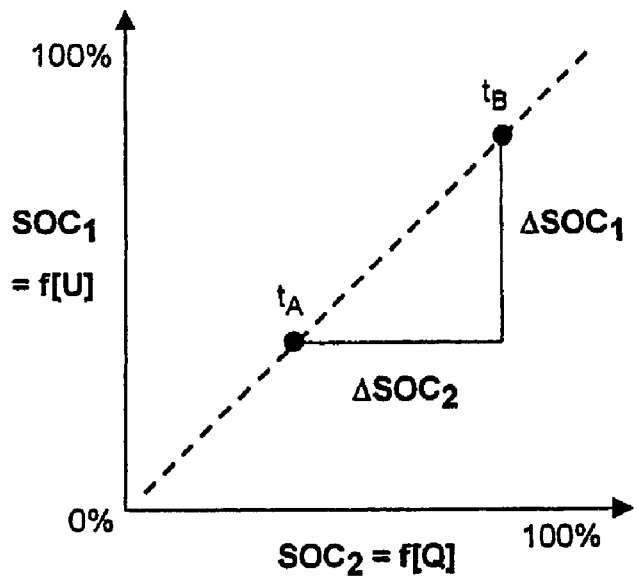
FIG. 4 shows a graph of the change in a first state of charge value in comparison to the change in a second state of charge value for a net charge, and approximately the same change.

FIG. 4 shows the situation where there is a net charge, when the increase in the magnitude of the first state of charge value $\Delta SOC_1$ is in the same order of magnitude as the increase in the second state of charge value $\Delta SOC_2$ between the first operating time $t_A$ and the second operating time $t_B$. Once again, no preferred consideration is then given to the first or to the second state of charge value $SOC_1$ or $SOC_2$ for determination of the state of charge SOC.

Figure 5:
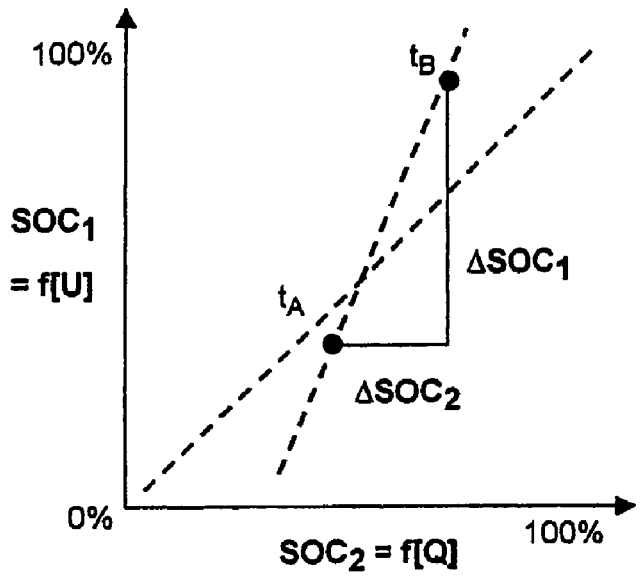
FIG. 5 shows a graph of a greater change in the first state of charge value than the change in the second state of charge value for a net charge.

In contrast, as is sketched in FIG. 5 for the situation in which there is a net charge, the first state of charge value $SOC_1$ at the second operating time $t_B$ is used to a greater extent for determination of the state of charge SOC when the magnitude of the change in the first state of charge value $\Delta SOC_1$ is greater than the magnitude of the change in the second state of charge value $\Delta SOC_2$.

It is also possible to determine a capacity loss value $Q_s$, which is subtracted from all of the state of charge values SOC determined in the future, in order additionally to take account of corruption in those states in which it is not manifested by any influence on the terminal voltage.

The effect which is used for determination of an improved state of charge value SOC can be explained as follows, using the example of acid stratification.

When acid stratification occurs, the increased acid density in the lower area of the storage battery governs the terminal voltage. In this case, discharging takes place with preference at the bottom of the area of the high acid density. In consequence, a discharge with a charge transfer $\Delta Q$ reduces the local acid density predominantly in the lower area, and thus reduces the rest voltage $U_0$ to a relatively greater extent than if the discharge were to take place homogenously over the physical height of the storage battery.

The discrepancy between the comparatively major change in the measured terminal voltage for a given charge transfer $\Delta Q$ during a discharge is made use of in this case.

When acid stratification is present, charging preferably takes place in the center and in the upper area of the storage battery, where the acid density is lower. Charging with a charge transfer $\Delta Q$ therefore increases the local acid density there to a greater extent than if the discharge were to take place homogeneously over the physical height. However, since the acid density in the center and in the upper area does not govern the rest voltage, this is unchanged, despite charging. At the least, the magnitude of the change is less than is observed during discharging.

The discrepancy between the comparatively minor change in the measured terminal voltage for a given charge transfer $\Delta Q$ during charging is made use of in this case.

It is also important to note that the method described with respect to the exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited in the claims. Accordingly, all such modifications are intended to be included within the scope of the present invention as defined in the appended claims. The order or sequence of any process or method steps may be varied or re-sequenced according to alternative embodiments. Other substitutions, modifications, changes and omissions may be made in the design, operating conditions and arrangement of the exemplary embodiments without departing from the scope of the present invention as expressed in the appended claims.

What is claimed is:

1. A method for determining a characteristic variable which relates to the state of charge (SOC) of a storage battery, the method comprising:
   determining a first state of charge value which relates to a first parameter for a first operating time and for a second operating time;
   determining a second state of charge value which relates to a second parameter for the first operating time and for the second operating time;
   determining a first state of charge change of the first state of charge value from the first operating time to the second operating time;
   determining a second state of charge change of the second state of charge value from the first operating time to the second operating time;
   determining the characteristic variable for acid stratification for the storage battery which relates to the state of charge as a function of the first state of charge change and of the second state of charge change.

2. The method of claim 1 wherein the first parameter is a voltage of the storage battery.

3. The method of claim 2 wherein the first parameter is a rest voltage ($U_{00}$) of the storage battery.

4. The method of claim 2 wherein the second parameter is a current throughput of the storage battery.

5. The method of claim 4 wherein the step of determining the second state of charge value comprises the step of balancing the current which flows between the first operating time and the second operating time as the amount of charge transferred.

6. The method of claim 1 wherein the characteristic variable is determined as a function of whether a net discharge from or a net charge to the storage battery takes place between the first operating time and the second operating time.

7. The method of claim 1 wherein the characteristic variable is determined as a function of which absolute value of the first state of charge change and of the second state of charge change is greater.

8. The method of claim 1 wherein the second state of charge value is used in an emphasized form to determine the characteristic variable where there is a net discharge of the storage battery in the time period between the first operating time and the second operating time and where the magnitude of the first state of charge change is less than that of a second state of charge change.

9. The method of claim 1 wherein the first state of charge value is used in an emphasized form to determine the characteristic variable where there is a net charge of the storage battery in the time period between the first operating time and the second operating time and where the magnitude of the first state of charge change is less than that of a second state of charge change.

10. The method of claim 1 wherein the step of determining a characteristic variable for acid stratification for the storage battery is a function of the difference between the first state of charge change and the second state of charge change, wherein the first state of charge change relates to the voltage of the storage battery and the second state of charge change relates to the current throughput of the storage battery.

11. The method of claim 10 further comprising deducing that acid stratification has occurred when the first state of charge change is greater than the second state of charge change where there is a net discharge of the storage battery.

12. The method of claim 10 further comprising deducing acid stratification when the first state of charge change is less than the second state of charge change where there is a net charge of the storage battery.

13. The method of claim 10 further comprising comparing a difference between the first state of charge change and the second state of charge change with a fixed threshold value to compare the ratio of the magnitudes between the first state of charge change and the second state of charge change.

14. The method of claim 13 wherein the fixed threshold value is in the range from 1 to 10% of a maximum possible state of charge value for the storage battery.

15. The method of claim 1 wherein the second parameter is a current throughput of the storage battery and wherein only charge amounts and discharge amounts which exceed a fixed minimum value are taken into account for determination of the second state of charge value.

16. The method of claim 15 wherein the fixed minimum value is in the range from 1 to 10% of a maximum possible state of charge value for the storage battery.

17. The method of claim 1 further comprising determining at least one of a state of charge value and a storage capability value for the storage battery and correcting such determined value.

18. The method of claim 17 wherein the step of correcting the determined value comprises subtracting from the determined value the difference between the first state of charge change and the second state of charge change.

19. The method of claim 17 wherein the step of correcting the determined value comprises subtracting from the determined value the product of the rated capacity of the storage battery and the difference between the first state of charge change and the second state of charge change.

20. The method of claim 18 further comprising determining a set of differences between the first state of charge change and the second state of charge change.

21. The method of claim 20 wherein the step of correcting the determined value utilizing the greatest difference of the set of differences.

22. The method of claim 19 further comprising determining a set of differences between the first state of charge change and the second state of charge change.

23. The method of claim 20 wherein the step of correcting the determined value utilizing the greatest difference of the set of differences.

24. The method of claim 17 further comprising determining a set of differences between the first state of charge change and the second state of charge change.

25. The method of claim 24 wherein the step of correcting the determined value comprises subtracting the sum of all of the determined differences from the determined value.

26. The method of claim 24 wherein the step of correcting the determined value comprises subtracting from the determined value the product of the sum of all of the determined differences times the rated capacity of the storage battery.

27. The method of claim 1 wherein the step of determining the characteristic variable comprises determining the characteristic variable as a function of the first state of charge change and the second state of charge change only when a net discharge and a net charge take place in two different time intervals.

28. The method of claim 1 further comprising deducing that acid stratification has occurred when a discharge ratio between the first state of charge change and the second state of charge change in a first time interval is greater than a charge ratio between the first state of charge change and the second state of charge change in a second time interval.

29. The method of claim 28 wherein no charge throughput takes place between the first time interval and the second time interval.

30. The method of claim 1 further comprising controlling a charging procedure for the storage battery as a function of the characteristic variable which has been determined.

31. The method of claim 1 further comprising controlling a charging procedure for the storage battery as a function of the first and the second state of charge changes.

32. The method of claim 1 wherein the storage battery is a lead-acid rechargeable battery.

* * * * *